United States Patent
Levinski et al.

(10) Patent No.: US 8,004,679 B2
(45) Date of Patent: Aug. 23, 2011

(54) TARGET DESIGN AND METHODS FOR SCATTEROMETRY OVERLAY DETERMINATION

(75) Inventors: Vladimir Levinski, Nazareth Ilit (IL); Daniel Kandel, Aseret (IL)

(73) Assignee: KLA-Tencor Corporation, San Jose, CA (US)

( * ) Notice: Subject to any disclaimer, the term of this patent is extended or adjusted under 35 U.S.C. 154(b) by 311 days.

(21) Appl. No.: 12/395,883

(22) Filed: Mar. 2, 2009

(65) Prior Publication Data

US 2009/0279091 A1  Nov. 12, 2009

Related U.S. Application Data

(60) Provisional application No. 61/051,853, filed on May 9, 2008.

(51) Int. Cl.
*G01B 11/00* (2006.01)

(52) U.S. Cl. ........................................................ 356/401

(58) Field of Classification Search ........... 356/399–401
See application file for complete search history.

(56) References Cited

U.S. PATENT DOCUMENTS

| | | | |
|---|---|---|---|
| 7,277,172 B2 | 10/2007 | Kandel et al. | |
| 7,298,481 B2 | 11/2007 | Mieher et al. | |
| 7,616,313 B2 * | 11/2009 | Kandel et al. | 356/401 |
| 2002/0135875 A1 * | 9/2002 | Niu et al. | 359/564 |
| 2003/0002043 A1 | 1/2003 | Abdulhalim et al. | |
| 2005/0195398 A1 * | 9/2005 | Adel et al. | 356/401 |
| 2007/0279630 A1 * | 12/2007 | Kandel et al. | 356/401 |
| 2008/0024766 A1 * | 1/2008 | Mieher et al. | 356/73 |
| 2008/0094630 A1 * | 4/2008 | Mieher et al. | 356/401 |
| 2009/0284744 A1 * | 11/2009 | Mieher et al. | 356/399 |

* cited by examiner

*Primary Examiner* — Hoa Q Pham
(74) *Attorney, Agent, or Firm* — Weaver Austin Villeneuve & Sampson LLP (57) ABSTRACT

Disclosed are methods and apparatus for determining overlay error. Radiation that is scattered from each of a plurality of cells of a target is measured. Each cell includes at least a first grating structure formed by a first process and a second grating structure formed by a second process and wherein each cell has a predefined offset between such each cell's first and second grating structures. The first and second grating structures of the different cells have different predefined offsets, and each predefined offset of each cell is selected to cause one or more terms to be cancelled from a periodic function that represents radiation scattered and measured from each cell. The scattered radiation of each cell is represented with a periodic function having a plurality of unknowns parameters, including an unknown overlay error, and the unknown overlay error is determined based on the plurality of periodic functions for the plurality of cells.

21 Claims, 6 Drawing Sheets

| Cell 1 | | Cell 2 | | Cell 3 | | Cell 4 | |
|---|---|---|---|---|---|---|---|
| Sub-cell 1 | Sub-cell 2 | Sub-cell 1 | Sub-cell 2 | Sub-cell 1 | Sub-cell 2 | Sub-cell 1 | Sub-cell 2 |
| $\varepsilon + 11P/24$ | $\varepsilon + 7P/24$ | $\varepsilon + 5P/24$ | $\varepsilon + P/24$ | $\varepsilon - P/24$ | $\varepsilon - 5P/24$ | $\varepsilon - 7P/24$ | $\varepsilon - 11P/24$ |

| Cell 1 | Cell 2 | Cell 3 | Cell 4 |
|---|---|---|---|
| $\varepsilon + 3P/8$ | $\varepsilon + P/8$ | $\varepsilon - P/8$ | $\varepsilon - 3P/8$ |

TARGET DESIGN AND METHODS FOR SCATTEROMETRY OVERLAY DETERMINATION

CROSS REFERENCE TO RELATED APPLICATIONS

The present application claims priority under 35 U.S.C. §119(e) from U.S. Provisional Patent Application No. 61/051,853 entitled "NEW APPROACHES FOR TARGET DESIGN FOR SCATTEROMETRY OVERLAY DETERMINATION" filed 9 May 2008 by Vladimir Levinski et al., which application is incorporated herein by reference for all purposes.

BACKGROUND OF THE INVENTION

The present invention relates to determination of overlay between structures formed in single or multiple layers. More particularly, it relates to determining overlay based on radiation scattering from such structures.

In various manufacturing and production environments, there is a need to control alignment between various layers of samples, or within particular layers of such samples. For example, in the semiconductor manufacturing industry, electronic devices may be produced by fabricating a series of layers on a substrate, some or all of the layers including various structures. The relative position of such structures both within particular layers and with respect to structures in other layers is relevant or even critical to the performance of completed electronic devices.

The relative position of structures within such a sample is sometimes called overlay. Various technology and processes for measuring overlay have been developed and employed with varying degrees of success. More recently, various efforts have been focused on utilizing radiation scatterometry as a basis for overlay metrology.

Some approaches to determining overlay from scatterometry measurements concentrate on comparison of the measured spectra to calculated theoretical spectra based on model shape profiles, overlay, and film stack, and material optical properties (n,k dispersion curves), or comparison to a reference signal from a calibration wafer.

In another scatterometry approach for determining overlay, overlay targets having predefined offsets between the periodic structures of two different process layers are utilized. The offsets are generally selected so that overlay may be determined from the spectra measured from such target without using calculated theoretical or calibration data.

Although these scatterometry techniques work well under certain conditions, it is a continuing goal to strive towards improved scatterometry techniques, for example, that increase accuracy, efficiency, and/or minimize the area utilized for the overlay targets.

SUMMARY OF THE INVENTION

In one embodiment, a method of determining overlay error is disclosed. Radiation that is scattered from each of a plurality of cells of a target is measured. Each cell includes at least a first grating structure formed by a first process and a second grating structure formed by a second process and wherein each cell has a predefined offset between such each cell's first and second grating structures. The first and second grating structures of the different cells have different predefined offsets, and each predefined offset of each cell is selected to cause one or more terms to be cancelled from a periodic function that represents radiation scattered and measured from each cell. The scattered radiation of each cell is represented with a periodic function having a plurality of unknowns parameters, including an unknown overlay error, and the unknown overlay error is determined based on the plurality of periodic functions for the plurality of cells.

In a specific aspect, the number of cells is less than the number of the unknown parameters in each periodic function prior to the one or more terms being cancelled from such periodic function. In another aspect, the number of terms in each periodic function is four and the number of unknown parameters is five prior to cancellation of the one or more terms, wherein the number of terms is three and the number of unknown parameters is four after cancellation. In a specific implementation, the number of cells equals four and has a same period, P. In a further aspect, each cell includes a first sub-cell and second sub-cell that each have a first and second grating structure, and each predefined offset of each sub-cell is selected to cause one or more terms to be cancelled from a periodic function that represents radiation scattered and measured from each cell. In this aspect, the first and second structures of each first and second sub-cell of the plurality of cells have a same period, P. The predefined offset of the first sub-cell of a first one of the cells is $+11P/24$; the predefined offset of the second sub-cell of the first cell is $+7P/24$; the predefined offset of the first sub-cell of a second one of the cells is $+5P/24$; the predefined offset of the second sub-cell of the second cell is $+P/24$; the predefined offset of the first sub-cell of a third one of the cells is $-P/24$; the predefined offset of the second sub-cell of the third cell is $-5P/24$; the predefined offset of the first sub-cell of a fourth one of the cells is $-7P/24$; and the predefined offset of the second sub-cell of the third cell is $-11P/24$.

In another implementation, the first structures of the plurality of cells have a same period, P. In this implementation, the predefined offset of a first one of the cells is $+3P/8$; the predefined offset of a second one of the cells is $+P/8$; the predefined offset of a third one of the cells is $-P/8$; and the predefined offset of a fourth one of the cells is $-3P/8$. In a further aspect, the second structures of the plurality of cells have a same period, 2P, and each second structure includes two sub-structures per period separated by a distance, 2a. Each sub-structure has a width distance, d, such that a parameter x equals $2a+d$, whereby x equals $3P/4$, $5P/4$, $P/2$, or $5P/6$. In another further aspect, each of the second structures of the plurality of cells is non-periodic and has an average period, P. In one embodiment, a lateral distance between the centers of each pair of adjacent sub-structures, along a first direction, varies according to a saw-tooth function so that the lateral distance includes values having a medium value of P, a maximum value of $P+\Delta$ and a minimum value of $P-\Delta$, wherein $\Delta$ is selected to cause one or more terms to be cancelled from each periodic function. In a specific embodiment, $\Delta$ equals $P/3$.

In an alternative embodiment, the invention pertains to a target for determining overlay error. The target includes a plurality of cells. Each cell includes at least a first grating structure formed by a first process and a second grating structure formed by a second process, and each cell has a predefined offset between such each cell's first and second grating structures. The first and second grating structures of the different cells have different predefined offsets, and the different predefined offsets between of the different cells are selected to cause one or more terms to be cancelled from each of a plurality of periodic functions that represent radiation that is scattered and measured from each cell. In specific embodiments, the target is configured as described above.

In another embodiment, the invention pertains to an apparatus for determining overlay error of a target. The apparatus includes a scatterometry module for measuring radiation that is scattered from each of a plurality of cells of a target, and each cell includes at least a first grating structure formed by a first process and a second grating structure formed by a second process. Each cell has a predefined offset between such each cell's first and second grating structures, and the first and second grating structures of the different cells have different predefined offsets. Each predefined offset of each cell is selected to cause one or more terms to be cancelled from a periodic function that represents radiation scattered and measured from each cell. The apparatus further comprises a processor that is configured to represent the scattered radiation of each cell with a periodic function having a plurality of unknowns parameters, including an unknown overlay error and determine the unknown overlay error based on the plurality of periodic functions for the plurality of cells. In specific implementations, the target is configured as described above.

These and other features will be presented in more detail in the following specification of the invention and the accompanying figures which illustrate by way of example the principles of the invention.

BRIEF DESCRIPTION OF THE DRAWINGS

FIG. 2($a$) is a side view illustration of a patterned top layer L2 being offset by a predefined offset, +f, from a patterned bottom layer L1 in accordance with one embodiment of the present invention.

FIG. 2($b$) is a side view illustration of a patterned top layer L2 being offset by a predefined offset, +f, and an overlay error, +ϵ, from a patterned bottom layer L1 in accordance with one embodiment of the present invention.

FIG. 2($c$) is a side view illustration of a patterned top layer L2 being offset by a predefined offset, −f, from a patterned bottom layer L1 in accordance with one embodiment of the present invention.

FIG. 2($d$) is a side view illustration of a patterned top layer L2 being offset by a predefined offset, −f, and an overlay error, +ϵ, from a patterned bottom layer L1 in accordance with one embodiment of the present invention.

DETAILED DESCRIPTION OF SPECIFIC EMBODIMENTS

Reference will now be made in detail to specific embodiments of the invention. Examples of these embodiments are illustrated in the accompanying drawings. While the invention will be described in conjunction with these specific embodiments, it will be understood that they are not intended to limit the invention to one embodiment. On the contrary, they are intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general terms, embodiments of the present invention provide overlay targets (as well as apparatus and techniques for measuring same) in the form of a plurality of grating on grating structures that are designed so that overlay can be determined with a relatively high level of accuracy while minimizing the an area size upon which such targets are formed. Prior to describing specific target designs of the present invention, a scatterometry technique will first be described with respect to a generic grating on grating structure. A grating on grating structure can be designed to have a predefined pitch, P, and a predefined offset, f between the centers of the top and bottom gratings. The intensity of light, I, scattered and measured from the grating on grating structures can then be expressed as a periodic function, such as Fourier series.

$$I = A_o + A_1 \cos\left(\frac{2\pi(f+\varepsilon)}{P}\right) + A_2 \cos\left(\frac{4\pi(f+\varepsilon)}{P}\right) + A_3 \cos\left(\frac{6\pi(f+\varepsilon)}{P}\right) + \ldots$$

where $A_m$ is the amplitude of the corresponding m harmonic (e.g., harmonics 0, 1, 2, etc.), and c is the overlay. The number of unknowns in this series, may include the amplitudes of the terms and the unknown overlay error. In general, the number of cells is selected so that all of the unknowns can be determined by representing each cell's measured scatterometry signal as a Fourier series and then solving for the unknowns. This series can be truncated at a certain order and the coefficients of the remaining terms are obtained by a fit of the measured intensities of the grating on grating structures. However, the accuracy of the determined overlay depends on the number of terms in the series. Since the number of terms is related to the number of grating on grating structures or cells, the accuracy also depends on the number of cells per target.

In embodiments of the present invention, overlay targets having a plurality of grating on grating cells with specific geometries are designed so that one or more high order terms are cancelled out of a Fourier series that is used to represent the measured scatterometry signals from such cells. Accordingly, when these cancelled one or more terms are dropped, their corresponding one or more unknowns are also dropped out of the series. As a result of less unknowns being present in the series, fewer targets than the initial number of unknown parameters (prior to dropping out) may be used to achieve more accurate results by initially using a higher number of terms, which then drop out and are not needed to solve for overlay.

A wide variety of target designs may be used to provide an accurate determination of overlay with fewer targets than the unknowns initially used in the representative functions (e.g., Fourier series), and the present invention is not limited to the target designs described below. In certain embodiments, a set of four scatterometry overlay cells are provided on a sample, such as a semiconductor production or test wafer. In other embodiments, more or less than four targets may be formed on a sample.

In a particular implementation, the sample has two or more layers of a semiconductor device, and the targets are utilized to provide a measure of the placement accuracy of various structures or patterns comprised in two or more layers of the device. A pattern can be described as a "pattern or interlayer pattern", with the two terms being synonymous under most circumstances. Commonly, placement accuracy is characterized by measurement of an overlay error between two different layers of the semiconductor device. In other implementations, placement error is characterized by measurement of an alignment error between two different patterns that were formed by two different processes in the same or different layer of the sample. More generally, overlay error can be measured between two different patterns generated by different pattern exposure steps or processes, and these two different patterns may be formed in a same or different layer.

Figure 1A:
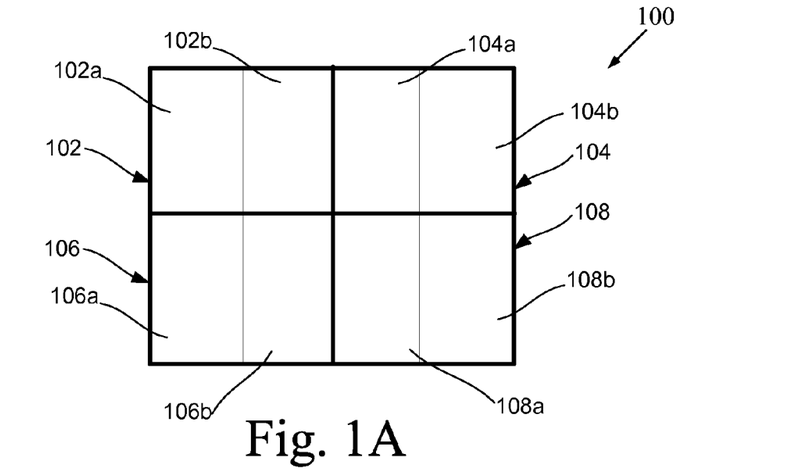
FIG. 1A is a top view diagrammatic representation of an overlay target having four cells, wherein each cell includes two sub-cells, in accordance with one embodiment of the present invention.

FIG. 1A is a top view diagrammatic representation of an overlay target 100 having four cells, wherein each cell includes two sub-cells, in accordance with one embodiment of the present invention. In this arrangement each cell and sub-cell is square or rectangular shaped. As shown, a first cell 102 includes sub-cells 102a and 102b; a second cell 104 includes sub-cells 104a and 104b; a third cell 106 includes sub-cells 106a and 106b; and a fourth cell 108 includes sub-cells 108a and 108b.

Figure 1B:
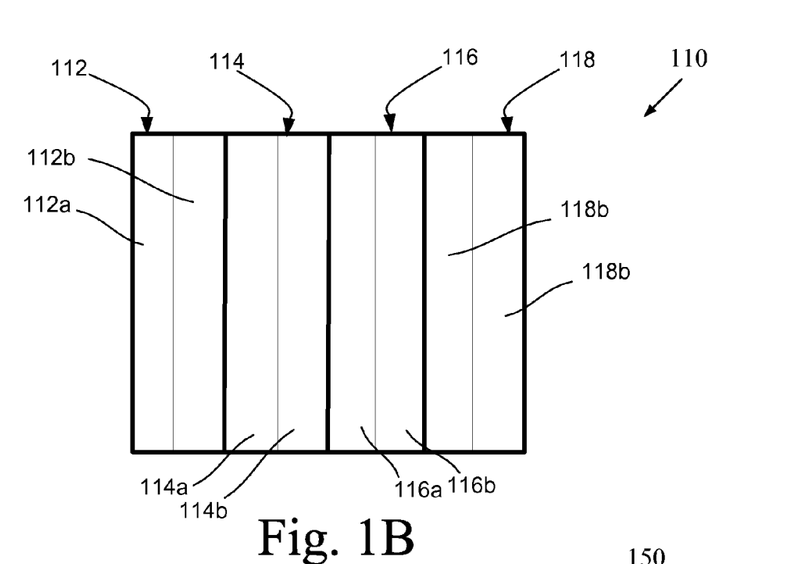
FIG. 1B is a top view diagrammatic representation of an overlay target having four cells, wherein each cell includes two sub-cells, in accordance with an alternative embodiment of the present invention.

FIG. 1B is a top view diagrammatic representation of an overlay target 110 having four cells, wherein each cell includes two sub-cells, in accordance with an alternative embodiment of the present invention. In this embodiment, each cell and sub-cell is an elongated rectangle. As shown, a first cell 112 includes sub-cells 112a and 112b; a second cell 114 includes sub-cells 114a and 114b; a third cell 116 includes sub-cells 116a and 116b; and a fourth cell 118 includes sub-cells 118a and 118b.

Although four cells and two sub-cells are illustrated, of course, a target may have any suitable number of cells and sub-cells. Additionally, although each sub-cell or cell is described as having a rectangular or square shape, any suitable shape may be utilized. Regardless of the particular configuration and shape of the cells and sub-cells, each sub-cell comprises a grating on grating structure in certain embodiments. In a specific implementation, the gratings have a same pitch, P, and the reflected intensities reflected from the two sub-cells of cell i is $I^{(i)} = I_1^{(i)} + I_2^{(i)}$ (i=1, 2, 3, or 4). The predefined offsets between the upper and lower grating of each sub-cell are chosen so that at least one term of a set of periodic functions is dropped. In one example, the predefined offsets between the upper and lower grating can have values as shown in table 150 of FIG. 1C. In this table, $\epsilon$ is the overlay error and the additional terms are predefined offsets that are applied to the target designs. As shown, sub-cell 1 of cell 1 has predefined offset +11P/24, and sub-cell 2 of cell 1 has predefined offset +7P/24. Sub-cell 1 of cell 2 has predefined offset +5P/24, and sub-cell 2 of cell 2 has predefined offset +P/24. Sub-cell 1 of cell 3 has predefined offset −P/24, and sub-cell 2 of cell 3 has predefined offset −5P/24. Sub-cell 1 of cell 4 has predefined offset −7P/24, and sub-cell 2 of cell 4 has predefined offset −11P/24.

Figure 1C:
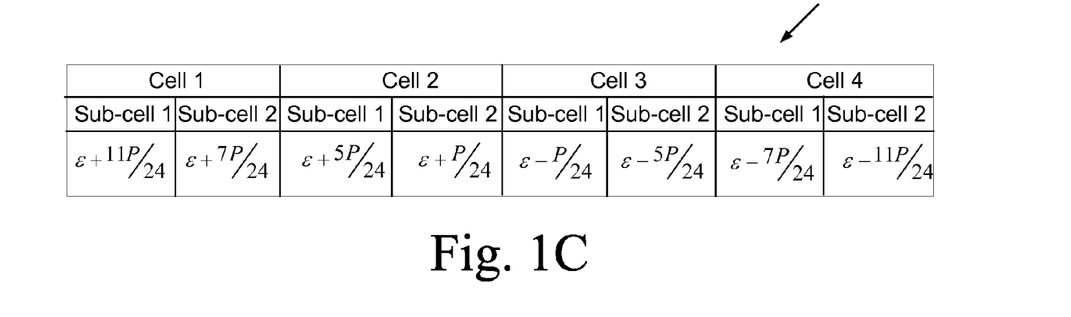
FIG. 1C is a table listing predefined offset values for the upper and lower grating of each sub-cell of a four cell target in accordance with one implementation of the present invention.

When these predefined offsets are used in a four cell, 2 sub-cell, target, the reflected intensity from cell 1 can be calculated using Equation 1:

$$I^{(1)} = I_1^{(1)} + I_2^{(1)} = 2A_0 + 2A_1\cos\left[\frac{2\pi}{P}\left(\varepsilon + \frac{3P}{4}\right)\right]\cos\left(\frac{\pi}{6}\right) + 2A_2\cos\left[\frac{4\pi}{P}\left(\varepsilon + \frac{3P}{4}\right)\right]\cos\left(\frac{\pi}{3}\right) + 2A_3\cos\left[\frac{6\pi}{P}\left(\varepsilon + \frac{3P}{4}\right)\right]\cos\left(\frac{\pi}{2}\right) + \ldots$$

In this expression, the third harmonic term would drop or cancel itself out of the equation, since $\cos(\pi/2)=0$. Similar results would be obtained with cells 2, 3, and 4. Since the third harmonic term drops out in this embodiment, a simpler dependence of the reflected light intensities on overlay may be obtained. That is, the reflected intensities from each cell may initially be represented by a four term series, which is more accurate than a three term series. Since one of the terms drops out (e.g., the third term drops out), there are a total of four remaining unknowns ($A_0$, $A_1$, $A_2$, and $\epsilon$) represented in three remaining harmonic terms, which can be solved by the four equations representing the four cells. In contrast, if the predefined offsets were configured so that a term does not drop out, five targets would need to be used achieve the same four term accuracy.

The number of targets and the magnitude and direction (+ or −) of their corresponding offsets may be chosen in any suitable manner so that the techniques of the present invention may be practiced to determine overlay error. Although specific sets of targets and their corresponding offsets are described herein, it should be readily apparent that there are numerous combinations of targets and offset values which may be utilized to practice the techniques and utilize the systems of the present invention.

Figure 2A:
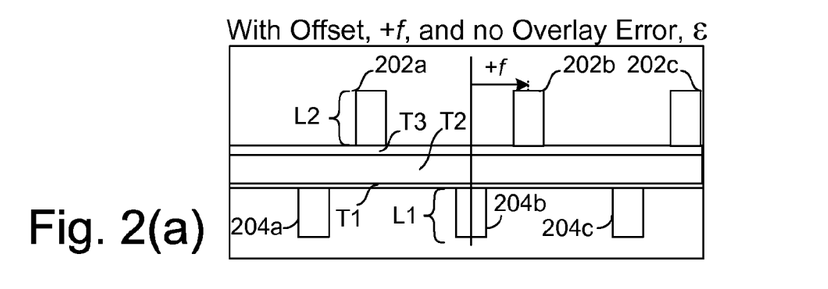

FIG. 2(a) is a side view illustration of a patterned top layer L2 being offset by a predefined offset, +f, from a patterned bottom layer L1 in accordance with one embodiment of the present invention. Each layer L1 and L2 is patterned into a set of structures. A structure may include any suitable grating feature, such as a line, trench or a row of contacts or other type structures. A structure may be designed to be similar to a semiconductor device feature. A structure may also be formed from a combination of different features. Further, a structure may be located on any layer of the sample, e.g., either above the top layer of the sample, within any layer of the sample, or partially or completely within a layer of the sample. In the illustrated embodiment of FIG. 2(a), layer L1 includes the complete structures 204a-c, while layer L2 includes the complete structures 202a-c. Construction of scatterometry overlay targets structures and methods for producing them are described in U.S. patent application, having publication no. 2003/0002043 A1, published 2 Jan. 2003, by Abdulhalim, et al., which application is herein incorporated by reference in its entirety.

As shown, the structures of the top layer L2 are offset by an amount +f from the structures of the bottom layer L1. The structures of the two offset layers may be located within adjacent layers or have any suitable number and types of layers disposed in between the two offset layers. FIG. 2(a) also shows three films T1, T2, and T3 between patterned layers L1 and L2 and their corresponding structures. To the extent that any other layers exist between the two layers having the structures, these other layers exhibit at least a minimum degree of transmission for electromagnetic radiation to permit propagation of the radiation between the layers having the structures. If the intervening layers are opaque, these layers would typically have a minimum degree of topography induced by the bottom grating to permit measurement of radiation reflected from that topography.

Figure 2B:
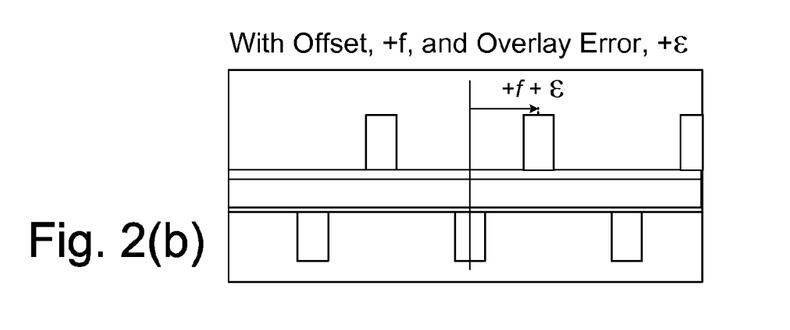
Figure 2C:
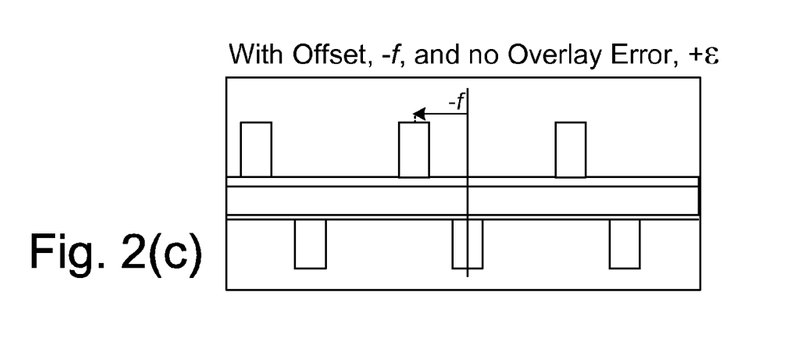
Figure 2D:
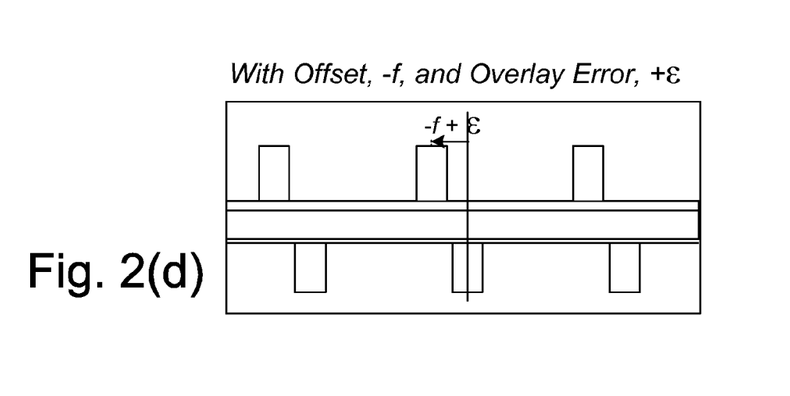

FIG. 2(b) is a side view illustration of a patterned top layer L2 being offset by a predefined offset, +f, and an overlay error, +ϵ, from a patterned bottom layer L1 in accordance with one embodiment of the present invention. FIG. 2(c) is a side view illustration of a patterned top layer L2 being offset by a predefined offset, −f, from a patterned bottom layer L1 in accordance with one embodiment of the present invention. FIG. 2(d) is a side view illustration of a patterned top layer L2 being offset by a predefined offset, −f, and an overlay error, +ϵ, from a patterned bottom layer L1 in accordance with one embodiment of the present invention.

Figure 3A:
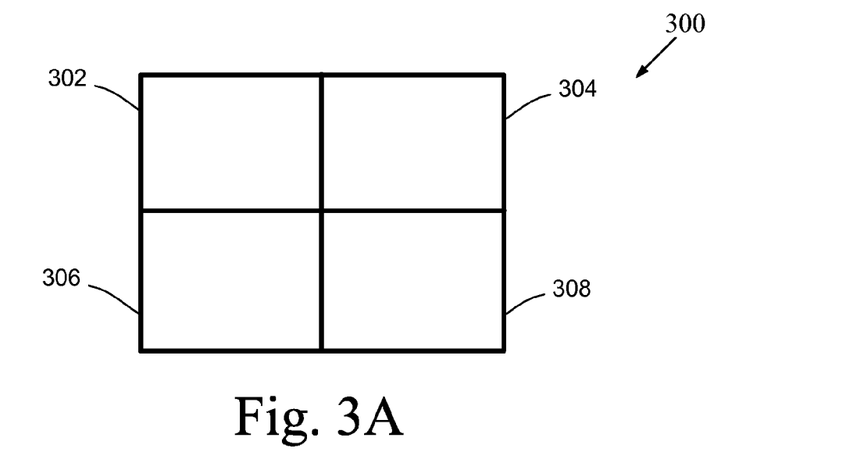
FIG. 3A is a top view diagrammatic representation of an overlay target having four cells without sub-cells in accordance with one embodiment of the present invention.
Figure 3B:
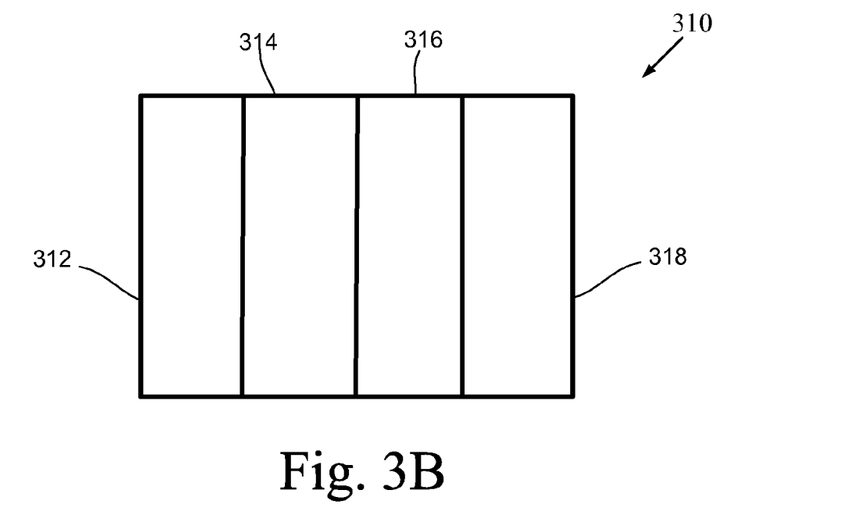
FIG. 3B is a top view diagrammatic representation of an overlay target having four cells without sub-cells in accordance with an alternative embodiment of the present invention.

FIG. 3A is a top view diagrammatic representation of an overlay target 300 having four cells without sub-cells in accordance with another embodiment of the present invention. As shown, the target includes a first cell 302, a second cell 304, a third cell 306, and a fourth cell 308. The four cells in this example have a rectangular or square shape. FIG. 3B is a top view diagrammatic representation of an overlay target 310 having four cells without sub-cells in accordance with an alternative embodiment of the present invention. This target 310 includes four elongated rectangular cells: a first cell 312, a second cell 314, a third cell 316, and a fourth cell 318.

Regardless of the target cell shape or number, the predefined offsets between the upper and lower grating of each cell are chosen so that at least one term of a set of periodic functions that represent measured signals from such cell is dropped. In one example, the predefined offsets between the upper and lower grating can have values as shown in table 350 of FIG. 3C. In this table, ϵ is the overlay error and the additional terms are predefined offsets that are applied to the target designs. As shown, cell 1 has predefined offset +3P/8, cell 2 has predefined offset +P/8, cell 3 has predefined offset −P/8, and cell 4 has predefined offset −3P/8.

Figure 4A:
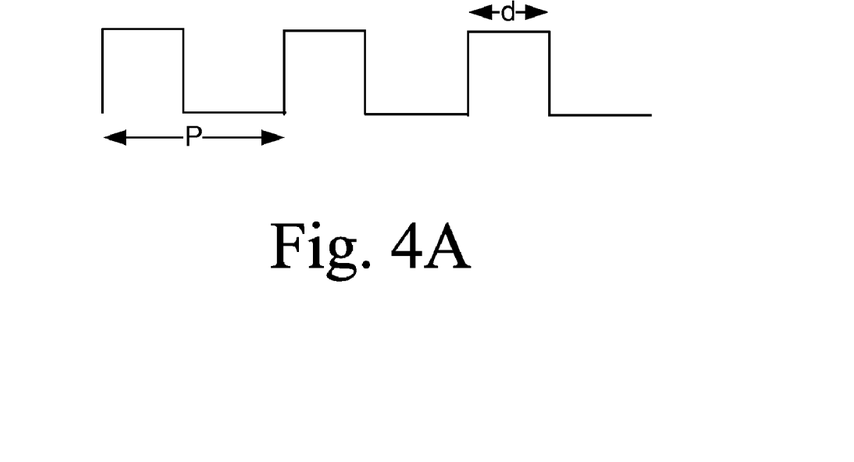
FIGS. 4A and 4B represent a double pitch target design in accordance with one implementation of the present invention.
Figure 4B:
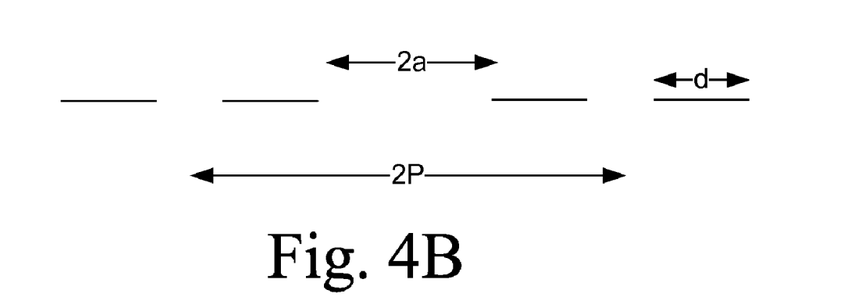

In certain embodiments, the grating on grating structure in each cell includes two gratings with a first one similar to the structure of FIG. 4A, which P represents a period of the grating, while d represents a thickness or width of each grating structure. For instance, if a grating is formed into a plurality of parallel bars, the period, P, is the distance between a first edge of a first bar and a first edge of a second bar. The distance, d, can characterize the width of each bar. The other grating may be represented by FIG. 4B, which has a double pitch target design in accordance with one implementation of the present invention. As shown, the other grating of each cell would have double the period, 2P, with two lines, trenches, or other structures per period. The second grating also has a distance, 2a, between each pair of structures and a distance, d, measurement for the width of each structure, wherein a parameter $\chi=2a+d$. The case $\chi=P$ corresponds to a grating of period P. The parameter $\chi$ can then be selected to cause one or more terms in the periodic equations that represent signals measured from a cell to drop out. If $\chi$ is set to 3P/4 or 5P/4, by way of examples, the second harmonic term in equation 1 drops out. In another example, if $\chi$ is set to P/2 or 5P/6, the third harmonic term drops out.

Figure 3C:
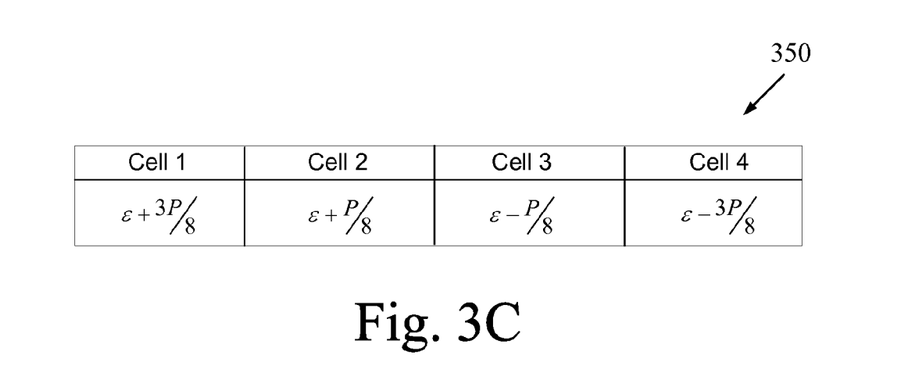
FIG. 3C is a table listing predefined offset values for the upper and lower grating of cell of a four cell target in accordance with one implementation of the present invention.
Figure 5:
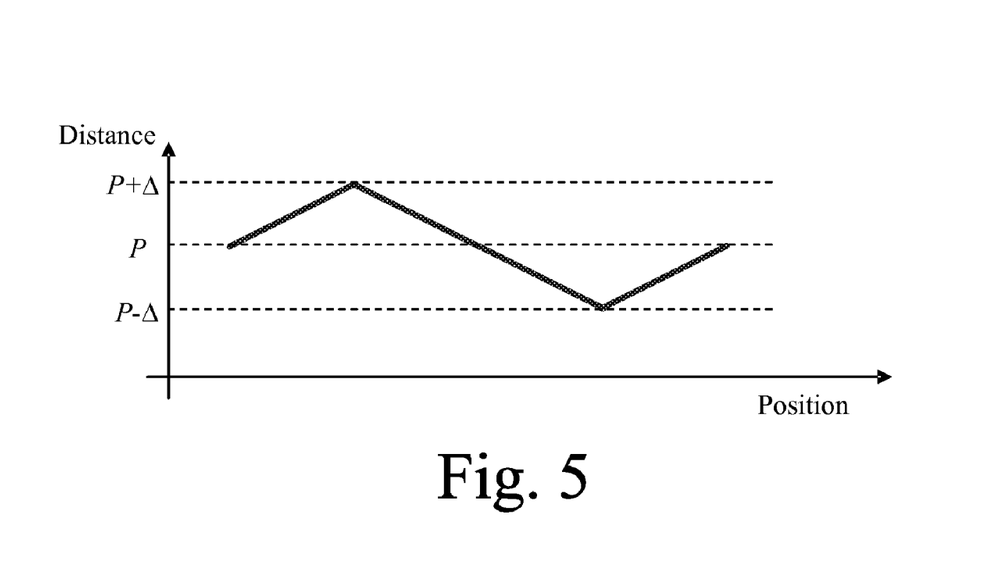
FIG. 5 is a graph of the distance between lines or trenches in a grating as a function of position in accordance with one implementation of the present invention.

In another embodiment, a four cell target without sub-cells can be designed with the same predefined offsets as listed in FIG. 3C. However, each cell has a periodic grating of pitch, P, in one of the gratings (e.g., bottom) and a non-periodic structure of average pitch, P, in the other grating (e.g., top). The lateral distance between the centers of the lines/trench/structures in this other non-periodic structure may behave according to the function of FIG. 5, by way of example. FIG. 5 is a graph of the distance between lines or trenches in the second grating as a function of position in accordance with one implementation of the present invention. The position corresponds to a position within each cell, e.g., along an x direction. That is, the pitch of each pair of structures would vary according to a saw-tooth function across the cell. Delta, Δ, can be selected so that one or more terms fall out of the periodic function (e.g., equation 1) for each cell. In a specific example, Δ equals P/3, and the third harmonic term vanishes from the Fourier series for each cell.

In general, an error offset ϵ in one direction, for example along the X-axis, may be determined by analyzing at least the measurements of scattered radiation (or any type of measured signals) obtained from cells or sub-cells that each having predefined offsets between two patterned layers. This analysis may be performed without comparing any of the measured spectra to a known or reference spectra (or signal) from a sample target having a known overlay error. In other words, the overlay error determination techniques of the present invention do not require a calibration operation.

Figure 6:
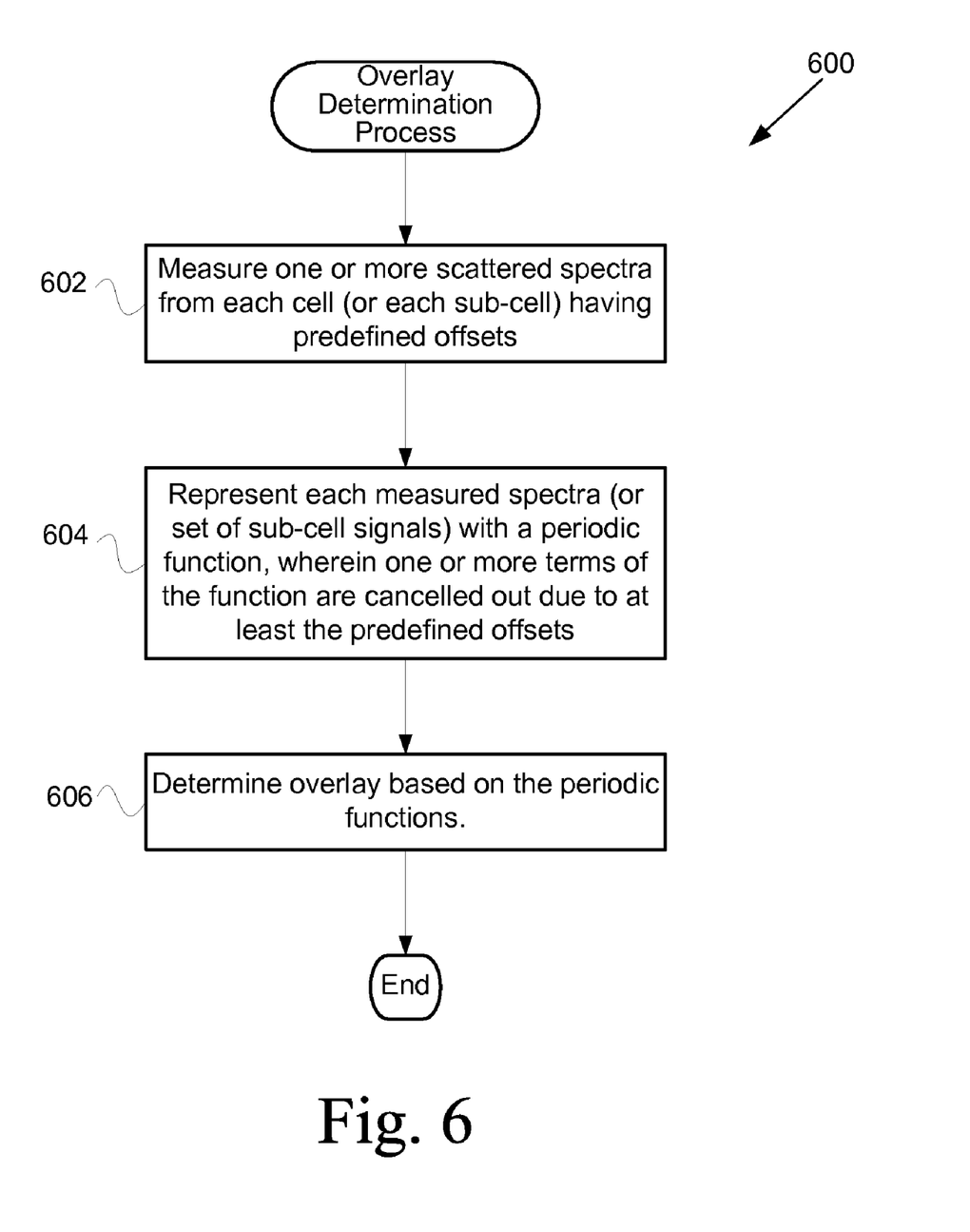
FIG. 6 is a flow chart illustrating a procedure for determining overlay error in accordance with one embodiment of the present invention.

FIG. 6 is a flow chart illustrating a procedure 600 for determining overlay error in accordance with one embodiment of the present invention. Initially, one or more scattered spectra are measured from each cell (or each sub-cell) having predefined offsets in operation 602. For instance, an incident radiation beam is directed towards each of the cell structures (or to each sub-cell structure of each cell) having a predefined offset to measure radiation scattered from such structures. The measurements may be carried out sequentially or simultaneously depending on the measurement system's capabilities. The incident beam may be any suitable form of electromagnetic radiation, such as laser, light emitting diode (LED), or broadband radiation.

Although the scatterometry techniques of the present invention are described as utilizing measured spectra or scattered radiation from a plurality of cells or sub-cells, any suitable type of measurable signal obtained from an overlay target may be used to practice the techniques of the present invention. Example signals include, but are not limited to, any type of spectroscopic ellipsometry or reflectometry signals, including: Ψ, Δ, Rs (complex reflectivity of the s polarization), Rp (complex reflectivity of the p polarization), Rs ($|r_s|^2$), Rp ($|r_p|^2$), R (unpolarized reflectivity), α (spectroscopic "alpha" signal), β (spectroscopic "beta" signal), and functions of these parameters, such as tan(Ψ), cos(Δ), ((Rs−Rp)/(Rs+Rp)), etc. The signals could alternatively or additionally be measured as a function of incidence angle, detection angle, polarization, azimuthal angle of incidence, detection azimuthal angle, angular distribution, phase, or wavelength or a combination of more than one of these parameters. The signals could also be a characterization of a combination of signals, such as an average value of a plurality of any of the above described ellipsometry and/or reflectometry signal types. The signals may alternatively take the form of a characteristic of one or more signal(s), such an intensity value(s) or a combination (e.g., average or addition) of intensity values. Other embodiments may use monochromatic or laser light sources where at least one of the signals may be obtained at a single wavelength instead of at multiple wavelengths.

Examples of optical systems and methods for measuring scatterometry signals to determine overlay may be found in U.S. Pat. No. 7,298,481, issued 20 Nov. 2007 by Mieher et al., which patent is herein incorporated by reference in its entirety. Further embodiments of suitable measurement systems and their use for determining overlay error are further described below.

After measurements are obtained from each target, each measured spectra or signal (or set of sub-cell spectra) are represented with a periodic function, such as a Fourier series, in operation 604. In this function, one or more terms are cancelled out due, in part, the predefined offsets.

The overlay error $\epsilon$ may then be determined based on the representative functions in operation 606. For instance, the plurality of periodic functions each include a plurality of unknowns, including an unknown overlay error, and these periodic functions can be used to determine the unknown overlay error. The measured spectra from the cells (or sub-cells) may be used to determine overlay of structures located at least partially in more than one layer, but could also be used to determine overlay of structures located substantially in a single layer.

In one target implementation, each of the cells (or sub-cells) comprises a grating structure Ga1 having periodic structures with a period Ta1 disposed at least partially within the first layer and a grating structure Ga2 having periodic structures with a period Ta2 disposed at least partially within the second layer (e.g., the target of FIG. 2a or 2c). Generally, a target could be any periodic structure like a particular device pattern repeated a number of times. One or more of the gratings Ga1 and/or Ga2 may be formed from device-like (e.g., design rule based) or process robust (e.g., low variability under variable process conditions) structures. The first layer period Ta1 and the second layer period Ta2 could be identical or different as well (in the simplest case Ta1=n*Ta2 or Ta2=n*Ta1, where n is an integer), and the predefined offsets are each produced by offsetting the structures with the period Ta1 of the grating structure Ga1 with respect to the structures with the period Ta2 of the grating structure Ga2 as described herein.

In another target embodiment, the composite periodic structure comprising Ga1 and Ga2 is periodic with a period Ta, and it is possible to describe both Ga1 and Ga2 in terms of the period Ta, with Ga1 possibly having a complex structure (complex unit cell with multiple components) and Ga2 also possibly having a different complex structure (complex unit cell with multiple components). For example, a unit cell may include a set of closely spaced line segments adjacent to a large flat area. This unit cell is repeated to form either or both grating Ga1 or Ga2. Gratings Ga1 and Ga2 may have the same or different unit cells. Additionally, the unit cells of Ga1 may be a rational or integer number of the units cells of grating Ga2, or visa versa. Gratings Ga1 and/or Ga2 may also be designed to be similar to the critical device features—i.e. share one or more of the device characteristics such as pitch, line width, etc. Scatterometry overlay targets designed to be similar to the device features may provide advantages by processing more similarly to the device features, including reflecting the pattern-dependent overlay effects such as pattern-placement error.

A scatterometry signal (as a function of the wavelength or incident angle, for example) may be acquired from each of the required SCOL targets. This signal is generally a periodic and even function of overlay error, for the case where the predefined offsets are measured from a symmetry position of one of the L1 or L2 patterns. Representing these signals with periodic functions utilize these properties of the signals.

The number of targets measured can be greater or equal to the cumulative number of free unknown parameters in the chosen function. If a periodic function has three terms (e.g., one term has disappeared from a four term function), there are four unknowns, for example, from Equation 1: $A_0, A_1, A_2$, and $\epsilon$. In this example, four cells may be used to solve for the four unknowns, which include overlay $\epsilon$.

In one embodiment, targets include more than one predefined offset, possibly between different sets of structures located in two layers, or possibly between different sets of structures located in more than two layers. In a general case, a target may include an indefinite number of layers, with all or some of these layers having structures producing predefined offsets. In a particular implementation, the structures in one or more underlying patterned layers of a target cause changes in the shape or topography of one or more upper layers (disposed above the underlying patterned layer(s)). In this implementation, the one or more upper layers may be substantially or partially opaque or absorbing, and at least part of the diffraction signal may arise from the topography of an upper layer, the topography arising at least in part from the underlying patterned layer.

According to one embodiment, structures included in a target may be organized in various configurations and shapes, including, for example, lines, grids, rectangles, squares, curved lines, curved shapes, circles, cylindrical shapes, conical shapes or combinations of the foregoing. Such configurations of structures may be disposed at various locations within the target, and may describe various angles with respect to the electromagnetic radiation incident on the target. For example, the sets of structures could be organized as a set of parallel lines perpendicular to the direction of propagation of a collimated set of radiation rays or of a beam incident on the target. In another case, the structures organized as a set of parallel lines could be disposed at an acute angle with respect to the incident radiation, possibly at an angle of 45 degrees. Such a configuration could be advantageous by facilitating determination of overlay in both x and y directions, thereby reducing the need for additional overlay patterns or measurements. Alternatively, the incident radiation could be directed to be substantially parallel to at least some of the parallel lines comprising the structures or defining the structures. This technique allows one to perform x and y overlay measurements without rotating the sample.

Several of the techniques of the present invention may be implemented using any suitable combination of software and/or hardware system. For example, the techniques may be implemented within an overlay metrology tool. Preferably, such metrology tool is integrated with a computer system which implements many of the operations of this invention. Such composite system preferably includes at least a scatterometry module for obtaining scatterometry signals of the overlay targets, and a processor configured to analyze the obtained scatterometry signals to thereby determine overlay error within such targets. At a minimum, the scatterometry module will usually include (i) a source of illumination oriented to direct radiation onto a specified location of the sample; and (ii) one or more detectors oriented to detect a scatterometry signal which has been scattered by the sample.

At least a portion of the techniques of the present invention may also be implemented in an overlay metrology system as an additional overlay measurement capability which complements an overlay measurement system or sub-system based on image analysis such as one used for conventional box-inbox or frame-in-frame overlay targets or other imaging type overlay measurement structures. Examples of apparatus are described in the above referenced U.S. Pat. No. 7,298,481, which is incorporated here by reference.

Regardless of the system's configuration, it may employ one or more memories or memory modules configured to store data, program instructions for the general-purpose inspection operations and/or the inventive techniques described herein. The program instructions may control the operation of an operating system and/or one or more applications. The memory or memories may also be configured to store scatterometry data obtained from the targets and overlay error results and optionally other overlay measurement data.

Because such information and program instructions may be employed to implement the systems/methods described herein, embodiments of the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 7:
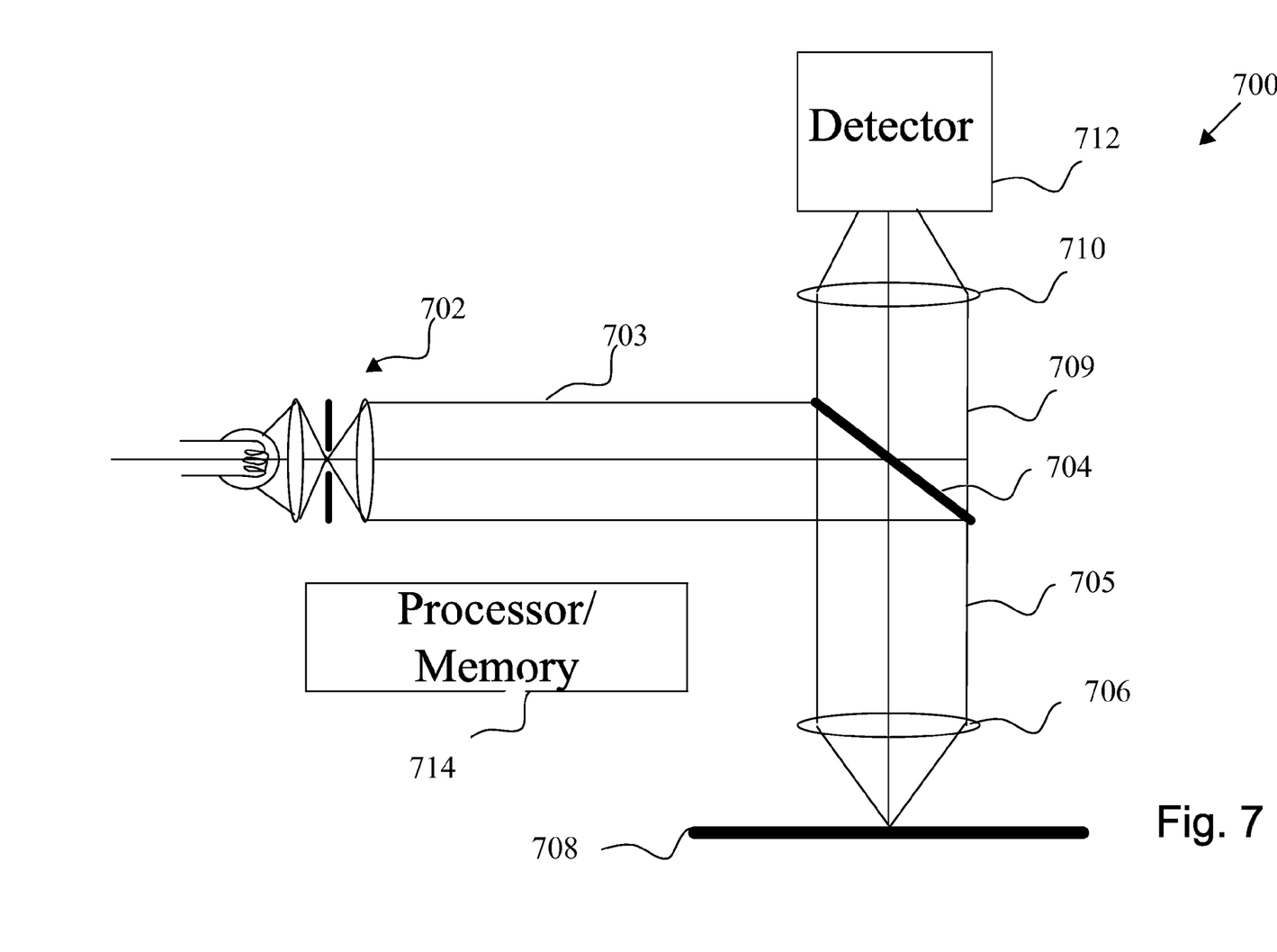
FIG. 7 is a diagrammatic representation of a measurement system in which techniques of the present invention may be implemented.

FIG. 7 is a diagrammatic representation of a measurement system 700 in which technique of the present invention may be implemented. As shown, the measurement system 700 includes a beam generator 702 for producing an incident beam 703 of electromagnetic radiation, a beam splitter 704 for directing the incident beam 705 towards the sample 708. Typically, the incident beam is focused onto the sample by a set of imaging lens 706. An output beam 709 is then emitted or scattered from the sample in response to the incident beam and passed through the beam splitter 704 through relay lens 710 onto detector 712. The detector 712 generates a signal of the sample based on the output beam 709.

The system 700 also includes a processor and one or more memory 714 which are configured to control the various components, such as the beam generator 702, imaging lens 706, and detector 712. The processor and memory are also configured to analyze the detected output beam implementing the various scatterometry techniques described above.

The overlay results obtained with scatterometry overlay techniques described herein may be used to calculate corrections to lithography stepper settings to minimize overlay error. These calculated corrections for lithography steppers or scanners are commonly referred to as "stepper correctables." The stepper correctables obtained from scatterometry overlay measurements may be used as inputs to the stepper to minimize overlay error for subsequent wafer processing. The overlay errors or stepper correctables obtained from scatterometry overlay may be input to an automated process control system which may then calculate a set of stepper corrections to input to the stepper to minimize the overlay errors for subsequent wafer processing. The overlay errors, stepper correctables, or calculated worst overlay errors on the wafer obtained with scatterometry overlay may be used to disposition product wafers to decide if the wafer requires rework or meets overlay requirements for further wafer processing.

Although the foregoing invention has been described in some detail for purposes of clarity of understanding, it will be apparent that certain changes and modifications may be practiced within the scope of the appended claims. For example, although the terms wafer or sample were used throughout (e.g., semiconductor), it should be noted that any type of work pieces may be utilized, such as substrates, photomasks, flat panel displays, electro-optic devices, and the like which are associated with other types of manufacturing. The term "stepper" was used throughout as an example to generically represent lithography systems in use or in development in the semiconductor industry and related industries and is not a limitation on the lithography systems which may include steppers, scanner, imprint lithographic systems, electron based lithographic patterning systems, EUV based lithographic patterning systems and the like. Therefore, the described embodiments should be taken as illustrative and not restrictive, and the invention should not be limited to the details given herein but should be defined by the following claims and their full scope of equivalents.

What is claimed is:

1. A method of determining overlay error, comprising:
measuring radiation that is scattered from each of a plurality of cells of a target, wherein each cell includes at least a first grating structure formed by a first process and a second grating structure formed by a second process and wherein each cell has a predefined offset between such each cell's first and second grating structures,
wherein the first and second grating structures of the different cells have different predefined offsets, and wherein each predefined offset of each cell is selected to cause one or more terms to be cancelled from a periodic function that represents radiation scattered and measured from each cell;
representing the scattered radiation of each cell with a periodic function having a plurality of unknowns parameters, including an unknown overlay error; and
determining the unknown overlay error based on the plurality of periodic functions for the plurality of cells.

2. The method of claim 1, wherein the number of cells is less than the number of the unknown parameters in each periodic function prior to the one or more terms being cancelled from such periodic function.

3. The method of claim 1, wherein the number of cells equals four and has a same period, P.

4. The method of claim 3, wherein each cell includes a first sub-cell and second sub-cell that each have a first and second grating structure, and wherein each predefined offset of each sub-cell is selected to cause one or more terms to be cancelled from a periodic function that represents radiation scattered and measured from each cell, and wherein the first and second structures of each first and second sub-cell of the plurality of cells have a same period, P, and wherein:
the predefined offset of the first sub-cell of a first one of the cells is +11P/24,
the predefined offset of the second sub-cell of the first cell is +7P/24,
the predefined offset of the first sub-cell of a second one of the cells is +5P/24,
the predefined offset of the second sub-cell of the second cell is +P/24,
the predefined offset of the first sub-cell of a third one of the cells is −P/24,
the predefined offset of the second sub-cell of the third cell is −5P/24,
the predefined offset of the first sub-cell of a fourth one of the cells is −7P/24, and
the predefined offset of the second sub-cell of the third cell is −11P/24.

5. The method of claim 3, wherein the first structures of the plurality of cells have a same period, P, and wherein:
the predefined offset of a first one of the cells is +3P/8,
the predefined offset of a second one of the cells is +P/8,
the predefined offset of a third one of the cells is −P/8, and
the predefined offset of a fourth one of the cells is −3P/8.

6. The method of claim 5, wherein the second structures of the plurality of cells have a same period, 2P, wherein each second structure includes two sub-structures per period separated by a distance, 2a, wherein each sub-structure has a width distance, d, such that a parameter x equals 2a+d, whereby x equals 3P/4, 5P/4, P/2, or 5P/6.

7. The method of claim 5, wherein each of the second structures of the plurality of cells is non-periodic and has an average period, P.

8. The method of claim 7, wherein a lateral distance between the centers of each pair of adjacent sub-structures, along a first direction, varies according to a saw-tooth function so that the lateral distance includes values having a medium value of P, a maximum value of P+Δ and a minimum value of P−Δ, wherein Δ is selected to cause one or more terms to be cancelled from each periodic function.

9. The method of claim 8, wherein Δ equals P/3.

10. The method of claim 3, wherein the number of terms in each periodic function is four and the number of unknown parameters is five prior to cancellation of the one or more terms, wherein the number of terms is three and the number of unknown parameters is four after cancellation.

11. A target for determining overlay error, comprising:
a plurality of cells,
wherein each cell includes at least a first grating structure formed by a first process and a second grating structure formed by a second process and wherein each cell has a predefined offset between such each cell's first and second grating structures,
wherein the first and second grating structures of the different cells have different predefined offsets, and wherein the different predefined offsets between of the different cells are selected to cause one or more terms to be cancelled from each of a plurality of periodic functions that represent radiation that is scattered and measured from each cell.

12. The target of claim 11, wherein the number of cells equals four and each cell includes a first sub-cell and second sub-cell that each have a first and second grating structure, and wherein each predefined offset of each sub-cell is selected to cause one or more terms to be cancelled from a periodic function that represents radiation scattered and measured from each cell, and wherein the first and second structures of each first and second sub-cell of the plurality of cells have a same period, P, and wherein:
the predefined offset of the first sub-cell of a first one of the cells is +11P/24,
the predefined offset of the second sub-cell of the first cell is +7P/24,
the predefined offset of the first sub-cell of a second one of the cells is 5P/24,
the predefined offset of the second sub-cell of the second cell is +P/24,
the predefined offset of the first sub-cell of a third one of the cells is −P/24,
the predefined offset of the second sub-cell of the third cell is −5P/24,
the predefined offset of the first sub-cell of a fourth one of the cells is −7P/24, and
the predefined offset of the second sub-cell of the third cell is −11P/24.

13. The target of claim 11, wherein the first structures of the plurality of cells have a same period, P, and wherein:
the predefined offset of a first one of the cells is +3P/8,
the predefined offset of a second one of the cells is +P/8,
the predefined offset of a third one of the cells is −P/8, and
the predefined offset of a fourth one of the cells is −3P/8.

14. The target of claim 13, wherein the second structures of the plurality of cells have a same period, 2P, wherein each second structure includes two sub-structures per period separated by a distance, 2a, wherein each sub-structure has a width distance, d, such that a parameter x equals 2a+d, whereby x equals 3P/4, 5P/4, P/2, or 5P/6.

15. The target of claim 13, wherein each of the second structures of the plurality of cells is non-periodic and has an average period, P.

16. The target of claim 15, wherein a lateral distance between the centers of each pair of adjacent sub-structures, along a first direction, varies according to a saw-tooth function so that the lateral distance includes values having a medium value of P, a maximum value of P+Δ and a minimum value of P−Δ, wherein Δ is selected to cause one or more terms to be cancelled from each periodic function.

17. The target of claim 16, wherein Δ equals P/3.

18. An apparatus for determining overlay error of a target, comprising:
a scatterometry module for measuring radiation that is scattered from each of a plurality of cells of a target, wherein each cell includes at least a first grating structure formed by a first process and a second grating structure formed by a second process and wherein each cell has a predefined offset between such each cell's first and second grating structures,
wherein the first and second grating structures of the different cells have different predefined offsets, and wherein each predefined offset of each cell is selected to cause one or more terms to be cancelled from a periodic function that represents radiation scattered and measured from each cell; and
a processor that is configured to perform the following operations:
represent the scattered radiation of each cell with a periodic function having a plurality of unknowns parameters, including an unknown overlay error; and
determine the unknown overlay error based on the plurality of periodic functions for the plurality of cells.

19. The apparatus of claim 18, wherein the number of cells is less than the number of the unknown parameters in each periodic function prior to the one or more terms being cancelled from such periodic function.

20. The apparatus of claim 18, wherein the number of cells equals four and has a same period, P.

21. The apparatus of claim 20, wherein the number of terms in each periodic function is four and the number of unknown parameters is five prior to cancellation of the one or more terms, wherein the number of terms is three and the number of unknown parameters is four after cancellation.

* * * * *